United States Patent
Yu et al.

(10) Patent No.: US 8,154,038 B2
(45) Date of Patent: Apr. 10, 2012

(54) GROUP-III NITRIDE FOR REDUCING STRESS CAUSED BY METAL NITRIDE REFLECTOR

(75) Inventors: Chen-Hua Yu, Hsin-Chu (TW);
Wen-Chih Chiou, Miaoli (TW);
Ding-Yuan Chen, Taichung (TW);
Chia-Lin Yu, Sigang (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 182 days.

(21) Appl. No.: 12/166,020

(22) Filed: Jul. 1, 2008

(65) Prior Publication Data
US 2010/0001302 A1  Jan. 7, 2010

(51) Int. Cl.
*H01L 33/00* (2010.01)
(52) U.S. Cl. ........................... 257/98; 257/E33.001
(58) Field of Classification Search ............... 257/98
See application file for complete search history.

(56) References Cited

U.S. PATENT DOCUMENTS

| | | | |
|---|---|---|---|
| 6,069,021 A * | 5/2000 | Terashima et al. | 438/46 |
| 6,531,719 B2 | 3/2003 | Shibata et al. | |
| 6,967,355 B2 | 11/2005 | Kryliouk et al. | |
| 7,842,939 B2 * | 11/2010 | Jorgenson et al. | 257/14 |
| 7,915,624 B2 | 3/2011 | Jorgenson | |
| 2007/0029568 A1 * | 2/2007 | Choo et al. | 257/99 |
| 2007/0241350 A1 * | 10/2007 | Kim | 257/90 |
| 2007/0290228 A1 * | 12/2007 | Yoshida | 257/190 |
| 2008/0054296 A1 * | 3/2008 | Yoon et al. | 257/103 |
| 2008/0217635 A1 * | 9/2008 | Emerson et al. | 257/98 |
| 2008/0283821 A1 * | 11/2008 | Park et al. | 257/13 |
| 2010/0065855 A1 * | 3/2010 | Yokoyama et al. | 257/76 |

FOREIGN PATENT DOCUMENTS

| | | |
|---|---|---|
| CN | 1825539 A | 8/2006 |
| JP | 2008-177525 | 7/2008 |
| TW | 200633248 | 9/2006 |
| TW | 264835 B | 10/2006 |
| TW | I264835 | 10/2006 |

OTHER PUBLICATIONS

Jorgenson, R.J., "III-Nitride Light-Emitting Devices with One or More Resonance Reflectors and Reflective Engineered Growth Templates for Such Devices, and Methods," U.S. Appl. No. 60/835,934 filed Aug. 6, 2006, 90 pages.

Jorgenson, R.J., "III-Nitride Light-Emitting Devices with One or More Resonance Reflectors and Reflective Engineered Growth Templates for Such Devices, and Methods," U.S. Appl. No. 60/821,588 filed Aug. 7, 2006, 119 pages.

Jorgenson, R.J., "Current Injecting/Tunneling Light Emitting Device and Method," U.S. Appl. No. 61/066,960 filed Feb. 25, 2008, 6 pages.

* cited by examiner

*Primary Examiner* — Thao P. Le
(74) *Attorney, Agent, or Firm* — Slater & Matsil, L.L.P.

(57) ABSTRACT

A device structure includes a substrate; a group-III nitride layer over the substrate; a metal nitride layer over the group-III nitride layer; and a light-emitting layer over the metal nitride layer. The metal nitride layer acts as a reflector reflecting the light emitted by the light-emitting layer.

18 Claims, 2 Drawing Sheets

GROUP-III NITRIDE FOR REDUCING STRESS CAUSED BY METAL NITRIDE REFLECTOR

TECHNICAL FIELD

This invention relates generally to a method of forming light-emitting diodes, and more particularly to a method of forming reflectors for the light-emitting diodes, and reducing the stresses caused by the reflectors.

BACKGROUND

Group-III nitride (often referred to as III-nitride, or III-N) compounds, such as gallium nitride (GaN) and its related alloys, have been under intense research in recent years due to their promising applications in electronic and optoelectronic devices. Particular examples of potential optoelectronic devices include blue light emitting diodes and laser diodes, and ultra-violet (UV) photo-detectors. The large bandgap and high electron saturation velocity of the III-nitride compounds also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material whose lattice constant and thermal expansion coefficient closely matching that of GaN. Among the possible substrates for GaN, silicon substrates were explored. Silicon substrates are attractive for GaN growth given their low cost, large diameters, high crystal and surface quality, controllable electrical conductivity, and high thermal conductivity. The use of silicon wafers promises easy integration of GaN based optoelectronic devices with silicon-based electronic devices.

A conventional light-emitting diode 2 is shown in FIG. 1, which includes silicon substrate 4, buffer layer 6 (for example, comprising AlN or BP) on silicon substrate 4, and light-emitting diode 8 on buffer layer 6. Light-emitting diode 8 includes n-type GaN layer 10, active layer 12, and p-type GaN layer 14. Contact 16 is formed on p-type GaN layer 14. The conventional light-emitting diodes suffer from drawbacks, however. Active layer 12 emits light to both the upward direction and the downward direction. The light emitted in the downward direction penetrates n-type GaN layer 10 and buffer layer 6 to reach silicon substrate 4. Silicon substrate 4 has a high absorption rate for light, particularly for the light with wavelengths between about 400 nm and about 500 nm. Therefore, a significant portion of the light emitted by the light-emitting diode is absorbed, causing the reduction of the light-emitting efficiency of the light-emitting diodes. Therefore, a method is needed to improve the light-emitting efficiency of light-emitting diodes.

SUMMARY OF THE INVENTION

In accordance with one aspect of the present invention, a device structure includes a substrate; a group-III nitride layer over the substrate; a metal nitride layer over the group-III nitride layer; and a light-emitting layer over the metal nitride layer. The metal nitride layer acts as a reflector reflecting the light emitted by the light-emitting layer.

In accordance with another aspect of the present invention, a device structure includes a semiconductor substrate; a first group-III nitride layer over the semiconductor substrate; a metal nitride reflector over the first group-III nitride layer; a second group-III nitride layer over the metal nitride reflector and electrically connected to the first group-III nitride layer; a light-emitting layer over the second group-III nitride layer, wherein the metal nitride reflector is adapted to reflect a light emitted by the light-emitting layer; and a third group-III nitride layer over the light-emitting layer.

In accordance with yet another aspect of the present invention, a device structure includes a silicon substrate; a backside contact underlying the silicon substrate; a first gallium nitride (GaN) layer over the silicon substrate; a metal nitride reflector over the first group-III nitride layer; a second GaN layer over the metal nitride reflector, wherein the first group-III nitride layer has a first thickness substantially no less than a second thickness of the second group-III nitride layer; a light-emitting layer over the second GaN layer, wherein the metal nitride reflector is adapted to reflect a light emitted by the light-emitting layer; a third GaN layer over the light-emitting layer; and a topside contact over the third group-III nitride layer and electrically connected to the backside contact through the first, the second, and the third GaN layers.

The advantageous features of the present invention include improved light-emitting efficiency and reduced stress applied to substrates.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel semiconductor structure including an optical device and a reflector is provided. The intermediate stages of manufacturing preferred embodiments of the present invention are discussed. The variations of the preferred embodiments are also discussed. Throughout the various views and illustrative embodiments of the present invention, like reference numbers are used to designate like elements.

Figure 1:
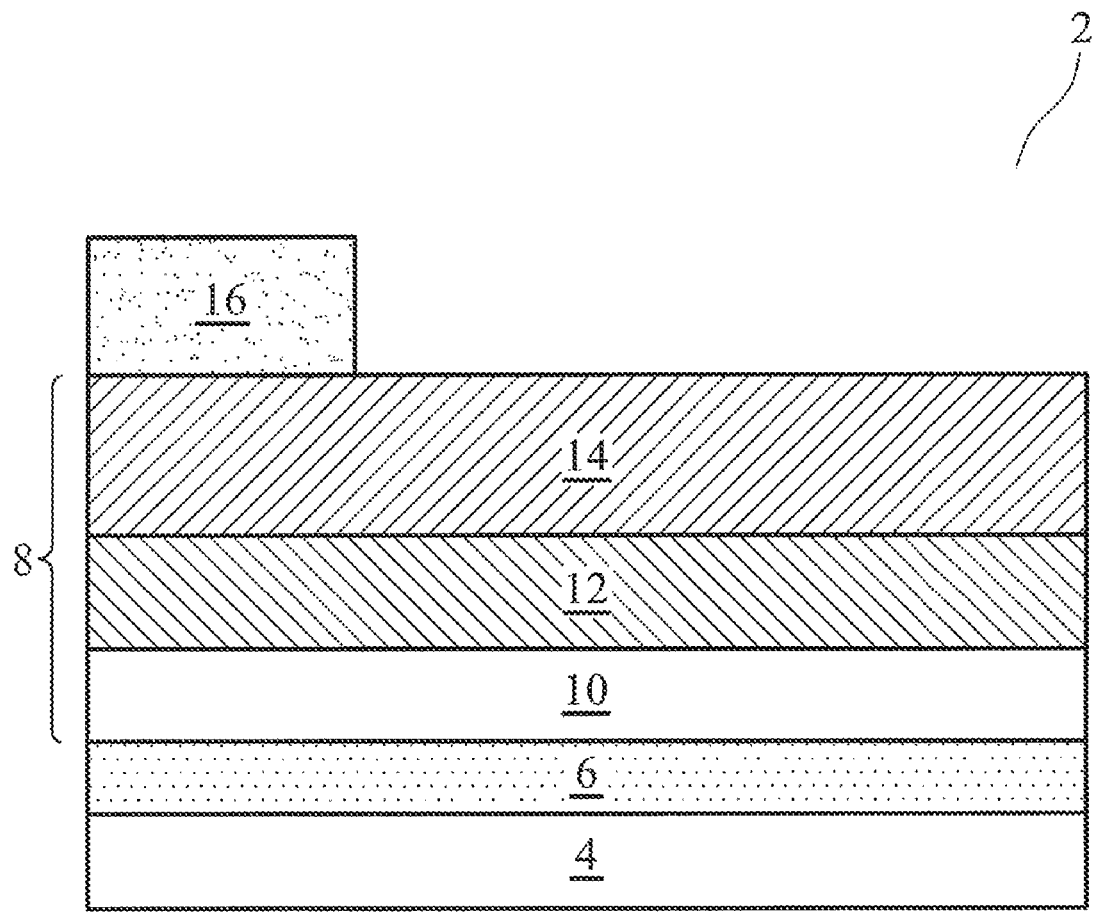
FIG. 1 illustrates a cross-sectional view of a conventional light-emitting diode.
Figure 2:
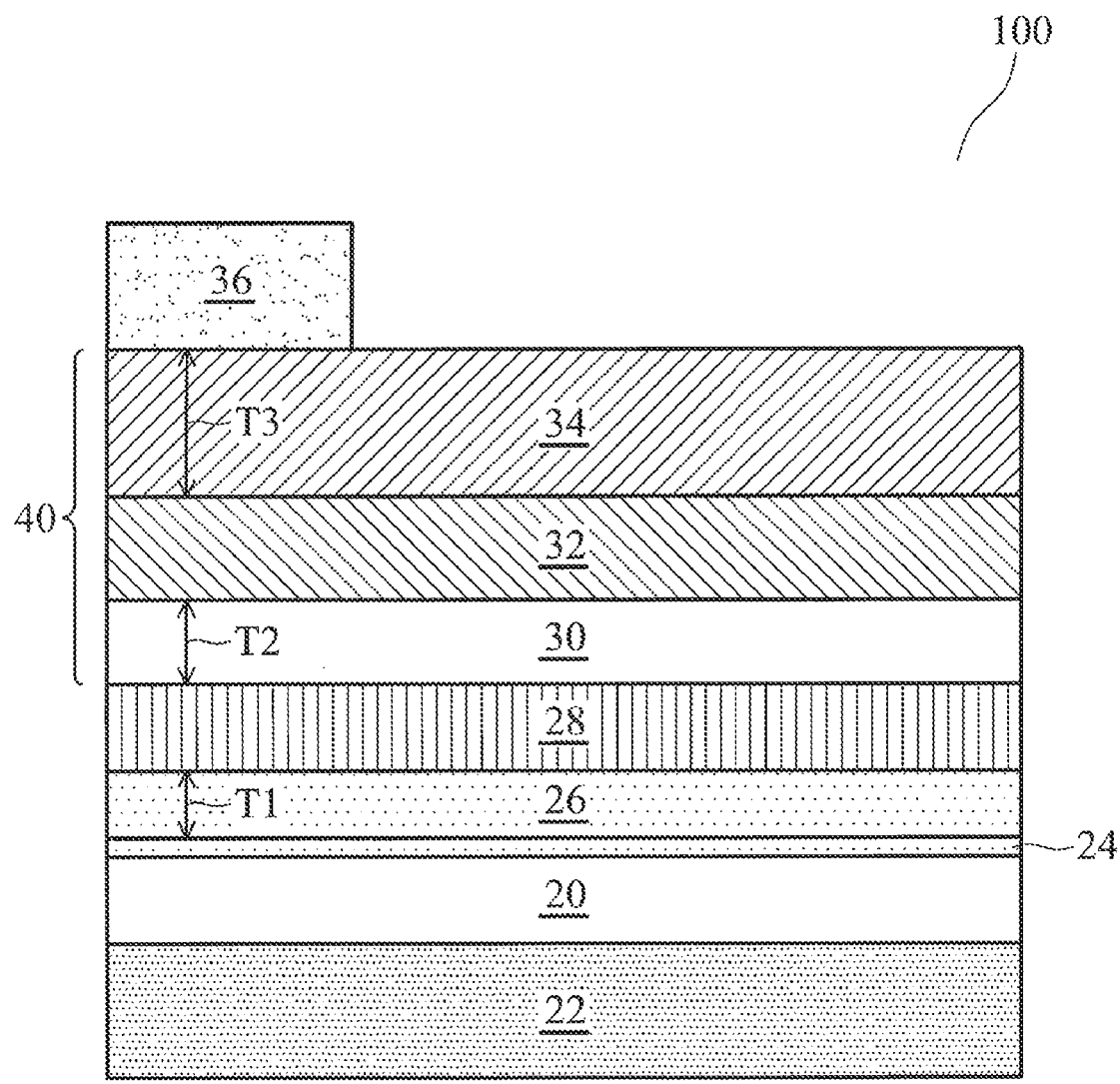
FIG. 2 illustrates a cross-sectional view of an embodiment of the present invention, wherein a metal reflector is formed between a light-emitting diode and the underlying substrate.

Referring to FIG. 2, substrate 20 is provided. In an embodiment, substrate 20 is a silicon (100) substrate having a (100) surface orientation. In other embodiments, substrate 20 may include silicon with a (110) or a (111) surface orientation. In yet other embodiments, substrate 20 may be formed of other semiconductor materials such as silicon carbon. Substrate 20 is preferably a bulk substrate.

In the case substrate 20 is formed of a semiconductor material such as silicon, substrate 20 is preferably doped with a p-type or n-type impurity, such as boron, indium, phosphorous, arsenic, or the like. Further, backside contact layer 22 is formed on the backside of substrate 20. In an embodiment, backside contact layer 22 is a semiconductor layer heavily doped with an impurity having a same conductivity type as the impurity in substrate 20. A silicide layer (not shown) may be formed on the bottom side of backside contact layer 22. Alternatively, backside contact layer 22 includes an alloy such as aluminum-antimony alloy.

Optionally, aluminum layer 24 is deposited on substrate 20. In an exemplary embodiment, aluminum layer 24 may be formed using sputtering or physical vapor deposition (PVD), to a thickness, for example, between about 10 nm and about 30 nm.

Next, stress-compensating layer 26 is formed. In an embodiment, stress-compensating layer 26 is formed of gallium nitride (GaN). In other embodiments, stress-compensating layer 26 includes other group-III nitrides, such as AlGaN, InGaN, or the like. The formation of stress-compensating layer 26 includes metal organic chemical mechanical deposition (MOCVD) or other applicable deposition methods. Stress-compensating layer 26 may be formed at a high temperature, for example, between about 700° C. and about 1100° C. Alternatively, stress-compensating layer 26 may be formed at a low temperature, for example, between about 300° C. and about 700° C. Accordingly, stress-compensating layer 26 may be referred to as a high-temperature group-III nitride layer or a low-temperature group-III nitride layer, depending on its formation temperature. The preferred thickness T1 of stress-compensating layer 26 is related to the thickness of subsequently formed lower cladding layer 30, as will be discussed in detail in subsequent paragraphs. In an exemplary embodiment, thickness T1 is greater than about 10 nm, and more preferably between about 50 nm and about 1000 nm. Stress-compensating layer 26 may be doped with a p-type or an n-type impurity, or substantially un-doped. Further, silicon may be doped in stress-compensating layer 26. Stress-compensating layer 26 preferably has an extinction coefficient (also referred to as imaginary refractive index) greater than 0.5.

Reflector 28 is formed on stress-compensating layer 26. In the preferred embodiment, reflector 2 is formed of a material at least semi-conductive, and preferably conductive, and capable of reflecting the light emitted by the overlying optical device 40. Particularly, reflector 28 preferably has a high reflectance for the specific wavelength of the light emitted by the overlying optical device 40. Accordingly, the material of reflector 28 may be selected according to the wavelength of the light it may absorb. Further, the material of reflector 28 may be selected so that its lattice constant matches that of stress-compensating layer 26 as close as possible. Exemplary materials of reflector 28 include titanium, titanium nitride, tantalum, tantalum nitride, or combinations thereof. Reflector 28 may also include a titanium nitride layer on a tantalum nitride layer, or a tantalum nitride layer on a titanium nitride layer. The methods for forming reflector 28 may include sputter, PVD, or the like.

Lower cladding layer 30 is formed on reflector 28. In an exemplary embodiment, lower cladding layer 30 comprises n-type (GaN). In this case, the lower cladding layer 30 may be formed using metal organic chemical vapor deposition (MOCVD) or remote plasma enhance chemical vapor deposition (RPECVD), at a high temperature, for example, higher than about 400° C., and more preferably between about 700° C. and about 1100° C. Exemplary precursors may include trimethylgallium (($CH_3$)$_3$Ga) and dimethylhydrazine. The thickness T2 of lower cladding layer 30 may be between about 500 nm and about 3000 nm.

Light-emitting layer 32 (also sometimes referred to as an active layer) is formed on lower cladding layer 30. In an exemplary embodiment, light-emitting layer 32 comprises undoped n-type gallium indium nitride ($Ga_aIn_bN_{(1-a-b)}$), wherein the respective precursors for forming light-emitting layer 32 may include trimethylindium (($CH_3$)$_3$In), trimethylgallium (($CH_3$)$_3$Ga) and dimethylhydrazine. In alternative embodiments, light-emitting layer 32 may include other commonly used materials such as $Al_xIn_yGa_{(1-x-y)}N$. The formation method includes MOCVD or other applicable CVD methods. The formation temperature may be between about 500° C. and about 1000° C. The thickness of light-emitting layer 32 may be between about 30 nm and about 500 nm.

Upper cladding layer 34 is formed on light-emitting layer 32. In an embodiment, upper cladding layer 34 comprises a material similar to that of lower cladding layer 30, such as GaN, except upper cladding layer 34 may be doped with a p-type impurity. The formation method of upper cladding layer 34 may be essentially the same as the method for forming lower cladding layer 30. The thickness T3 of upper cladding layer 34 may be between about 100 nm and about 300 nm.

Topside contact 36 is formed on upper cladding layer 34, and may be patterned. Topside contact 36 may be formed of a p-type ohmic material, such as Ni/Au, Ni/AuZn alloy. In the resulting structure as shown in FIG. 2, lower cladding layer 30, light-emitting layer 32, and upper cladding layer 34 form optical device (light-emitting diode) 40, which emits light when electrically activated. In alternative embodiments, optical device 40 may have different structures, and include different group-III nitrides other than GaN, such as InGaN or AlInGaN.

Reflector 28 advantageous reflects the light emitted by optical device 40, and hence the light is not absorbed by the underlying substrate 20. The light emitting efficiency of optical device 40 is thus improved. However, reflector 28 typically has a coefficient of thermal expansion (CTE) mismatched to the CTE of the overlying lower cladding layer 30, light-emitting layer 32, and upper cladding layer 34. The CTE mismatch will cause the bending of the respective semiconductor chip 100. By adding stress-compensating layer 26 under reflector 28, the bending caused by the overlying layers may be at least reduced, and possibly substantially eliminated. For example, assuming the CTE mismatch between reflector 28 and lower cladding layer 30 causes semiconductor chip 100 to be bowed, with edge portions of the semiconductor chip 100 being higher than the center portion, than stress-compensating layer 26 has the effect of bending the edge portions of semiconductor chip 100 down.

To maximize the effect of the stress compensation, the thickness T1 of stress-compensating layer 26 is at least not negligible compared to the thickness of lower cladding layer 30. In an exemplary embodiment, the thickness T1 of stress-compensating layer 26 is greater than about 10 percent, and more preferably between about 80 percent and 150 percent, of the thickness T2 of lower cladding layer 30. Since lower cladding layer 30 and upper cladding layer 34 may have substantially the same CTE, the thickness T1 of stress-compensating layer 26 may also be greater than the thickness T2 of lower cladding layer 30, and substantially equal to, or less than, the total thickness (T2+T3) of lower cladding layer 30 and upper cladding layer 34. In addition, the CTE of stress-compensating layer 26 is preferably substantially equal to the CTE of lower cladding layer 30. Accordingly, the formation temperatures of stress-compensating layer 26 and lower cladding layer 30 are preferably substantially equal to each other, so that the resulting magnitudes of the stresses applied by stress-compensating layer 26 and lower cladding layer 30 to reflector 28 are substantially equal to, and hence may cancel, each other. In an exemplary embodiment, the CTE of stress-compensating layer 26 is between about 50 percent and about 150 percent of the CTE of lower cladding layer 30.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device structure comprising:
    a substrate;
    a group-III nitride layer over the substrate;
    a metal nitride layer over the group-III nitride layer;
    a light-emitting layer over the metal nitride layer;
    a lower cladding layer over the metal nitride layer, wherein the lower cladding layer and the group-III nitride layer have essentially a same coefficient of thermal expansion, and wherein the group-III nitride layer has a thickness substantially no less than a thickness of the lower cladding layer; and
    a light-emitting layer over the lower cladding layer.

2. The device structure of claim 1, wherein the metal nitride layer comprises a material selected from the group consisting essentially of titanium, titanium nitride, tantalum, tantalum nitride, and combinations thereof.

3. The device structure of claim 1, wherein the group-III nitride layer comprises gallium nitride (GaN).

4. The device structure of claim 1 further comprising an upper cladding layer over the light-emitting layer, wherein the group-III nitride layer has a thickness greater than the thickness of the lower cladding layer, and substantially no greater than a total thickness of the thickness of the lower cladding layer and a thickness of the upper cladding layer.

5. The device structure of claim 1 further comprising a backside contact underlying the substrate, and a topside contact over the light-emitting layer, wherein the backside contact is electrically connected to the topside contact.

6. A device structure comprising:
    a semiconductor substrate;
    a first group-III nitride layer over the semiconductor substrate;
    a reflector over the first group-III nitride layer, wherein the reflector comprises a material selected from the group consisting essentially of tantalum and tantalum nitride;
    a second group-III nitride layer over the reflector and electrically connected to the first group-III nitride layer;
    a light-emitting layer over the second group-III nitride layer, wherein the reflector is adapted to reflect a light emitted by the light-emitting layer; and
    a third group-III nitride layer over the light-emitting layer.

7. The device structure of claim 6, wherein each of the first, the second, and the third group-III nitride layers comprises gallium nitride (GaN).

8. The device structure of claim 7, wherein the second group-III nitride layer is of n-type, and the third group-III nitride layer is of p-type.

9. The device structure of claim 6, wherein the first and the second group-III nitride layers are in physical contact with the reflector.

10. The device structure of claim 6 further comprising an aluminum layer between the semiconductor substrate and the first group-III nitride layer.

11. The device structure of claim 6, wherein the first group-III nitride layer has a first coefficient of thermal expansion (CTE) substantially equal to a second CTE of the second group-III nitride layer, and wherein the first group-III nitride layer has a first thickness substantially no less than a second thickness of the second group-III nitride layer.

12. The device structure of claim 11, wherein the first CTE is different from a third CTE of the reflector.

13. The device structure of claim 6 further comprising a backside contact underlying the semiconductor substrate, and a topside contact over the third group-III nitride layer, wherein the backside contact is electrically connected to the topside contact.

14. A device structure comprising:
    a silicon substrate;
    a backside contact underlying the silicon substrate;
    a first gallium nitride (GaN) layer over the silicon substrate;
    a metal nitride reflector over the GaN nitride layer;
    a second GaN layer over the metal nitride reflector, wherein the first GaN layer has a first thickness substantially no less than a second thickness of the second GaN layer;
    a light-emitting layer over the second GaN layer, wherein the metal nitride reflector is adapted to reflect a light emitted by the light-emitting layer;
    a third GaN layer over the light-emitting layer; and
    a topside contact over the third GaN layer and electrically connected to the backside contact through the first, the second, and the third GaN layers.

15. The device structure of claim 14, wherein the first, the second, and the third GaN layers are substantially free from metals.

16. The device structure of claim 14, wherein the metal nitride reflector comprises a material selected from the group consisting essentially of titanium, titanium nitride, tantalum, tantalum nitride, and combinations thereof.

17. The device structure of claim 14, wherein the metal nitride reflector adjoins the first and the second GaN layers.

18. The device structure of claim 14 further comprising an aluminum layer between the silicon substrate and the first GaN layer.

* * * * *

UNITED STATES PATENT AND TRADEMARK OFFICE
CERTIFICATE OF CORRECTION

PATENT NO.         : 8,154,038 B2
APPLICATION NO.    : 12/166020
DATED              : April 10, 2012
INVENTOR(S)        : Yu et al.

It is certified that error appears in the above-identified patent and that said Letters Patent is hereby corrected as shown below:

In Col. 5, line 28, claim 1, delete "a light-emitting layer over the metal nitride layer;".

Signed and Sealed this
Tenth Day of July, 2012

David J. Kappos
*Director of the United States Patent and Trademark Office*